United States Patent
Liaw

(10) Patent No.: US 9,659,599 B1
(45) Date of Patent: May 23, 2017

(54) MULTIPLE PORT DATA STORAGE DEVICE

(71) Applicant: Taiwan Semiconductor Manufacturing Co., Ltd., Hsinchu (TW)

(72) Inventor: Jhon Jhy Liaw, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/097,047

(22) Filed: Apr. 12, 2016

(51) Int. Cl.
| | |
|---|---|
| *G11C 5/06* | (2006.01) |
| *G11C 5/02* | (2006.01) |
| *G11C 7/00* | (2006.01) |
| *G11C 8/10* | (2006.01) |
| *H01L 23/528* | (2006.01) |
| *H01L 27/088* | (2006.01) |
| *H01L 27/02* | (2006.01) |
| *H01L 27/06* | (2006.01) |
| *H01L 25/065* | (2006.01) |
| *H01L 27/11* | (2006.01) |
| *G11C 11/418* | (2006.01) |

(52) U.S. Cl.
CPC .............. *G11C 5/02* (2013.01); *G11C 5/06* (2013.01); *G11C 7/00* (2013.01); *G11C 8/10* (2013.01); *G11C 11/418* (2013.01); *H01L 23/528* (2013.01); *H01L 25/0657* (2013.01); *H01L 27/0207* (2013.01); *H01L 27/0688* (2013.01); *H01L 27/088* (2013.01); *H01L 27/11* (2013.01)

(58) Field of Classification Search
CPC ........ G11C 5/025; G11C 7/18; G11C 11/4097
USPC .................................................. 365/63, 51
See application file for complete search history.

(56) References Cited

U.S. PATENT DOCUMENTS

| | | | |
|---|---|---|---|
| 8,605,523 B2 | 12/2013 | Tao et al. | |
| 8,630,132 B2 | 1/2014 | Cheng et al. | |
| 8,760,948 B2 | 6/2014 | Tao et al. | |
| 8,908,421 B2 | 12/2014 | Liaw | |
| 8,929,160 B2 | 1/2015 | Katoch et al. | |
| 8,964,492 B2 | 2/2015 | Hsu et al. | |
| 8,982,643 B2 | 3/2015 | Lum | |
| 9,117,510 B2 | 8/2015 | Yang et al. | |
| 9,208,858 B1 | 12/2015 | Lin et al. | |
| 9,218,872 B1 | 12/2015 | Liaw | |

(Continued)

*Primary Examiner* — Son Dinh
(74) *Attorney, Agent, or Firm* — Sterne, Kessler, Goldstein & Fox P.L.L.C.

(57) ABSTRACT

The present disclosure outlines front-end-of-line (FEOL) processing, middle-end-of-line (MEOL) processing, and back-end-of-line (BEOL) processing for fabricating a memory cell that can be implemented within a data storage device. The memory cell of the present disclosure represents a multiple port memory cell having at least three ports, such as a write-port, a first read-port, and a second read-port. The disclose FEOL processing is used to form semiconductor devices of the memory cell onto diffusion layers and polysilicon layers of a semiconductor layer stack. The disclosed MEOL processing is used to form interconnections, such as one or more vias and/or one or more contacts to provide some examples, between the semiconductor devices and metallization layers of the semiconductor layer stack. The disclosure BEOL processing is used to form the least three ports onto the metallization layers of the semiconductor layer stack.

20 Claims, 9 Drawing Sheets

(56) References Cited

U.S. PATENT DOCUMENTS

| | | |
|---|---|---|
| 2006/0239057 A1* | 10/2006 | Muller .................. G11C 11/412 |
| | | 365/63 |
| 2014/0153345 A1 | 6/2014 | Kim et al. |
| 2014/0233330 A1 | 8/2014 | Ko et al. |
| 2015/0348598 A1 | 12/2015 | Wang et al. |
| 2015/0371702 A1 | 12/2015 | Wu et al. |
| 2015/0380077 A1 | 12/2015 | Wu et al. |
| 2015/0380078 A1 | 12/2015 | Liaw |

* cited by examiner

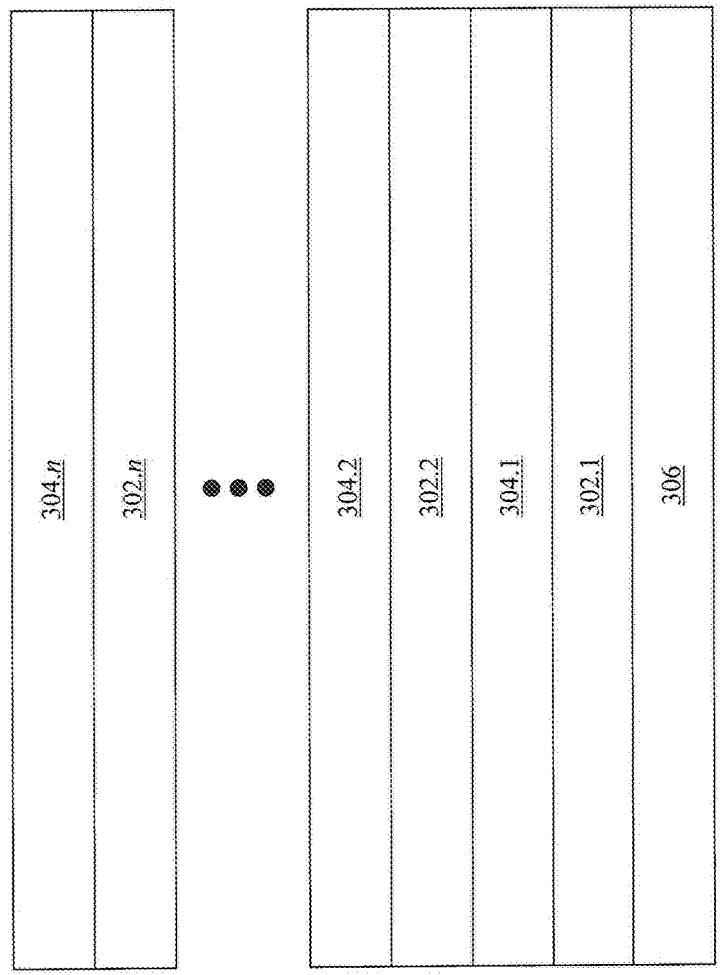

MULTIPLE PORT DATA STORAGE DEVICE

BACKGROUND

An integrated circuit layout is the representation of one or more integrated circuits in terms of planar geometric shapes which correspond to the patterns of metal, oxide, or semiconductor layers that form components of the integrated circuit. These integrated circuit layouts are translated by integrated circuit designers into an industry standard format, which is thereafter sent to a semiconductor foundry for manufacture onto the semiconductor substrate. The semiconductor foundry tailors its photolithographic process for fabrication using the integrated circuit layouts to fabricate the one or more integrated circuits onto the semiconductor substrate.

The various processes used by the semiconductor foundry to fabricate the one or more integrated circuits onto the semiconductor substrate include deposition, removal, patterning, and modification. The deposition is a process used by the semiconductor foundry to grow, coat, or otherwise transfer a material onto the semiconductor substrate and can include physical vapor deposition (PVD), chemical vapor deposition (CVD), electrochemical deposition (ECD), and/ or molecular beam epitaxy (MBE) to provide some examples. The removal is a process used by the semiconductor foundry to remove material from the semiconductor substrate and can include wet etching, dry etching, and/or chemical-mechanical planarization (CMP) to provide some examples. The patterning, often referred to as lithography, is a process used by the semiconductor foundry to shape or alter material of the semiconductor substrate to form the planar geometric shapes of the integrated circuit. The modification of electrical properties is a process used by the semiconductor foundry to shape or alter physical, electrical, and/or chemical properties of material of the semiconductor substrate, typically, by ion implantation. The semiconductor substrate used to fabricate the one or more integrated circuits is typically part of a semiconductor wafer. The semiconductor foundry can fabricate multiple of the one or more integrated circuits as well as other integrated circuits onto the semiconductor wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 illustrates an exemplary semiconductor layer stack according to an exemplary embodiment of the present disclosure;

DETAILED DESCRIPTION

Figure 1:
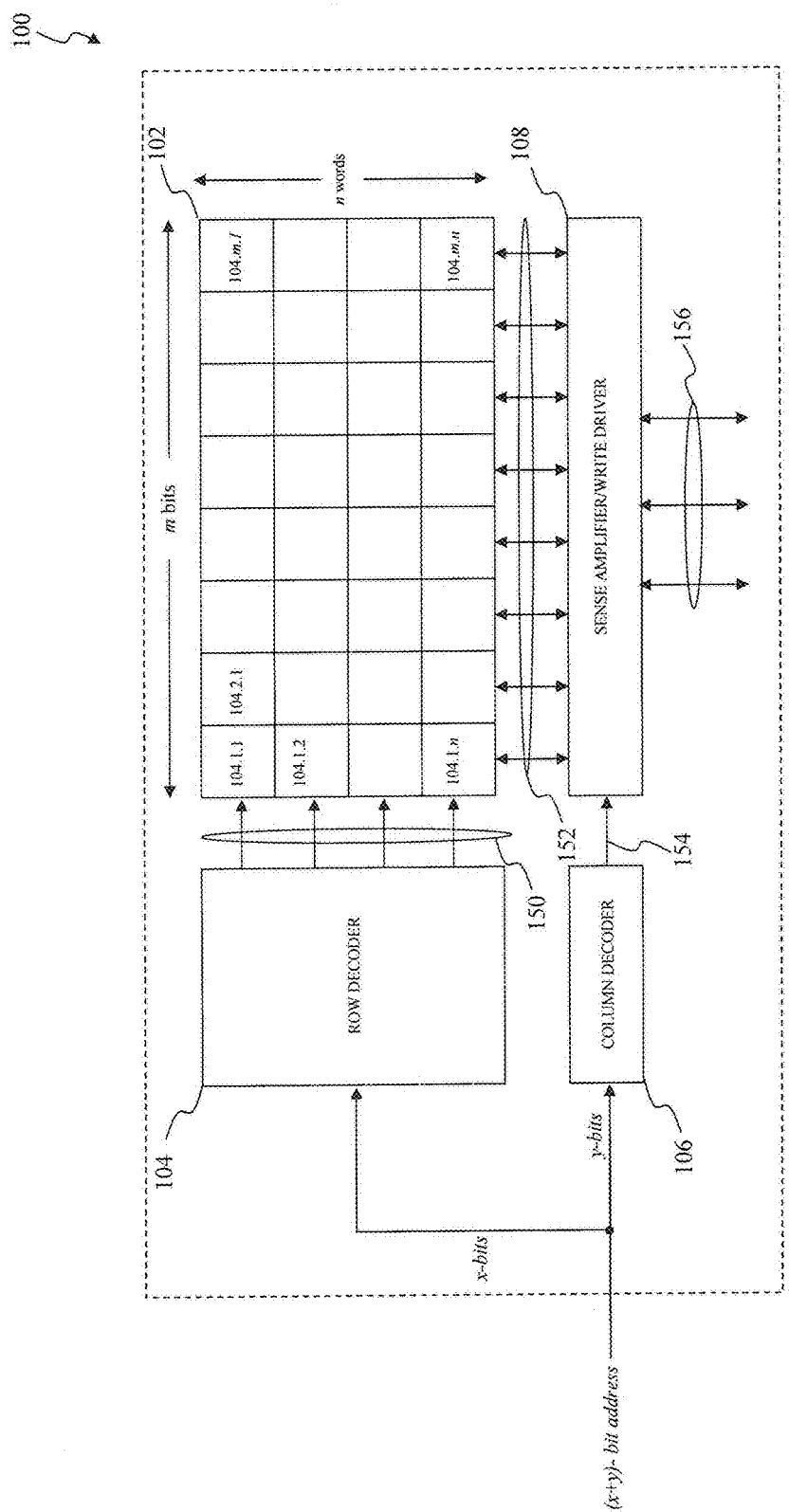
FIG. 1 illustrates a block diagram of a data storage device according to an exemplary embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

OVERVIEW

The present disclosure provides front-end-of-line (FEOL) processing, middle-end-of-line (MEOL) processing, and back-end-of-line (BEOL) processing for fabricating a memory cell that can be implemented within a data storage device. The memory cell of the present disclosure represents a multiple port memory cell having at least three ports, such as a write-port, a first read-port, and a second read-port. The disclosed FEOL processing is used to form semiconductor devices of the memory cell onto diffusion layers and polysilicon layers of a semiconductor layer stack. The disclosed MEOL processing is used to form interconnections, such as one or more vias and/or one or more contacts to provide some examples, between the semiconductor devices and metallization layers of the semiconductor layer stack. The disclosed BEOL processing is used to form the at least three ports onto the metallization layers of the semiconductor layer stack.

Exemplary Data Storage Device

FIG. 1 illustrates a block diagram of a data storage device according to an exemplary embodiment of the present disclosure. A data storage device 100 operates in a write mode of operation to write information to one or more memory cells that are configured to form an array of memory cells, or in a read mode of operation to read to information from the one or more memory cells. In the read mode of operation, the data storage device 100 reads information from one or more memory cells corresponding to an (x+y)-bit address. Similarly, the data storage device 100 writes information to one or more memory cells corresponding to an (x+y)-bit address in the write mode of operation. The data storage device 100 can be implemented as volatile memory, such as random access memory (RAM), which requires power to maintain the information or non-volatile memory, such as read-only memory (ROM), which maintains the information even when not powered. The RAM can be implemented as dynamic random-access memory (DRAM), static random-access memory (SRAM), and/or non-volatile random-access memory (NVRAM), such as flash memory to provide an example. The data storage device 100 includes a memory array 102, a row decoder 104, a column decoder 106, and a sense amplifier/write driver 108.

The memory array 102 includes memory cells 104.1.1 through 104.m.n that are arranged in an array of m columns and n rows. However, other arrangements for memory cells 104.1.1 through 104.m.n are possible without departing from the spirit and scope of the present disclosure. Each of the memory cells 104.1.1 through 104.m.n is connected to a corresponding WL from among WLs 150.1 through 150.n and a corresponding BL from among BLs 152.1 through 152.m. In an exemplary embodiment, the memory cells 104.1.1 through 104.m.n in each of the m columns of the memory array 102 shares a common BL from among the BLs 152.1 through 152.m. Similarly, the memory cells 104.1.1 through 104.m.n in each of n rows of memory array 102 share a common WL from among the WLs 150.1 through 150.n. For example, as shown in FIG. 3, the memory cells 104.1.1 through 104.m.1 of row 1 of the memory array 102 share the WL 150.1 and the memory cells 104.m.1 through 104.m.n of column m of memory array 102 share the BL 152.m.

To select a particular memory cell from among the memory cells 104.1.1 through 104.m.n for a mode of operation, such as the read mode of operation or the write mode of operation to provide some examples, the BL associated with the particular memory cell is selected, and the WL associated with this particular memory cell is selected. For example, the BL 152.1 and the WL 150.1 are selected to select memory cell 104.1.1. Thereafter, information is written into the selected memory cell in the write mode of operation, or information is read from the selected memory cell in the read mode of operation.

Each of the WLs 150.1 through 150.n is selectively asserted by applying a corresponding x-bit row address from among a corresponding (x+y)-bit address to row decoder 104. The row decoder 104 decodes the corresponding x-bit row address and provides the WLs 150.1 through 150.n that correspond to the x-bit row address to select a row of memory cells from among the memory cells 104.1.1 through 104.m.n. Similarly, each of the BLs 152.1 through 152.m is selected by applying a corresponding y-bit column address from among the corresponding (x+y)-bit address to the column decoder 106. The column decoder 106 decodes the y-bit column address and provides one or more control signals 154 to the sense amplifier/write driver 108 that correspond to the y-bit column address. The sense amplifier/write driver 108 selects a column of memory cells from among memory cells 104.1.1 through 104.m.n that corresponds to the y-bit column address.

The sense amplifier/write driver 108, using a sense amplifier, reads the information from a corresponding one or more BLs from among the BLs 152.1 through 152.m that corresponds to a selected one or more memory cells from among the memory cells 104.1.1 through 104.m.n during the read mode operation to provide information 156. Alternatively, the sense amplifier/write driver 108, using a write driver, receives the information 156 and writes the information 156 to corresponding BLs from among BLs 152.1 through 152.m that corresponds to a selected memory cell from among memory cells 104.1.1 through 104.m.n during the write mode of operation.

Figure 2:
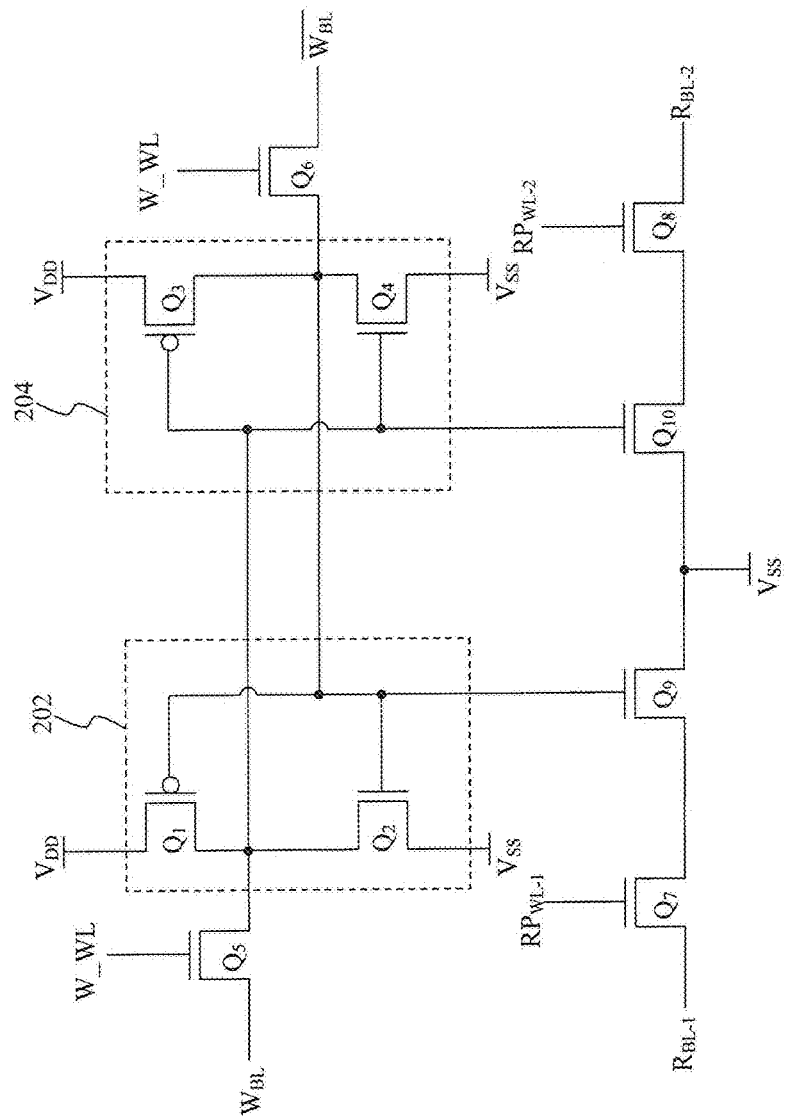
FIG. 2 illustrates a schematic diagram of a memory cell that can be implemented within the data storage device according to an exemplary embodiment of the present disclosure.

Exemplary Memory Cell that can be Implemented as Part of the Data Storage Device FIG. 2 illustrates a schematic diagram of a memory cell that can be implemented within the data storage device according to an exemplary embodiment of the present disclosure. A memory cell 200 operates in a write mode of operation to write information or in a read mode of operation to read to information. The memory cell 200 as illustrated in FIG. 2 represents a three port SRAM memory cell circuit. However, those skilled in the relevant art(s) will recognize that other configurations and arrangements are possible for the memory cell 200 without departing from the spirit and scope of the present disclosure. The memory cell 200 can represent an exemplary embodiment of one or more of the memory cells 104.1.1 through 104.m.n.

As illustrated in FIG. 2, the memory cell 200 includes a pair of cross-coupled inverting circuits. A first inverting circuit 202 from among the pair of cross-coupled inverting circuits being represented by a p-type metal-oxide-semiconductor (PMOS) transistor $Q_1$ and an n-type metal-oxide-semiconductor (NMOS) transistor $Q_2$ and a second inverting circuit 204 from among the pair of cross-coupled inverting circuits being represented by a PMOS transistor $Q_3$ and an NMOS transistor $Q_4$. An input of the first inverting circuit 202 is coupled to an output of the second inverting circuit 204 and an output of the first inverting circuit 202 is coupled to an input of the second inverting circuit 204 to form the pair of cross-coupled inverting circuits.

During the write mode of operation, a first port, denoted as W_WL in FIG. 2, is at a first logical level, such as a logic one to provide an example, and a second port, denoted as $RP_{WL\_1}$ in FIG. 2, and a third port, denoted as $RP_{WL\_2}$ in FIG. 2, are at a second logical level, such as a logic zero to provide an example. This configuration of the first port, the second port, and the third effectively writes information from WLs $W_{BL}$ and $\overline{W_{BL}}$ to the pair of cross-coupled inverting circuits. The WLs $W_{BL}$, and $\overline{W_{BL}}$ can represent an exemplary embodiment of one or more of the WLs 150.1 through 150.n. As illustrated in FIG. 2, the information passes from WLs $W_{BL}$ and $\overline{W_{BL}}$ onto the pair of cross-coupled inverting circuits through an NMOS transistor $Q_4$ and an NMOS transistor $Q_5$, respectively.

During the read mode of operation, the first port, denoted as W_WL in FIG. 2, is at the second logical level, and the second port, denoted as $RP_{WL\_1}$ in FIG. 2, and the third port, denoted as $RP_{WL\_2}$ in FIG. 2, are at the first logical level. This configuration of the first port, the second port, and the third effectively reads information from the pair of cross-coupled inverting circuits onto BLs $R_{BL\_1}$ and $R_{BL\_2}$. The BLs $R_{BL\_1}$ and $R_{BL\_2}$ can represent an exemplary embodiment of one or more of the BLs 152.1 through 152.m. As illustrated in FIG. 2, when the second port and the third port are at the first logical level, an NMOS transistor $Q_7$ and an NMOS transistor $Q_8$ are activated. When the first logical level, namely the logical one, is stored in the pair of cross-coupled inverting circuits, the input of the first inverting circuit 202 and the output of the second inverting circuit 204 are at the logical one. This configuration of the pair of cross-coupled inverting circuits activates an NMOS transistor $Q_9$ which causes the logical zero to pass onto the BL $R_{BL\_1}$. Similarly, when the second logical level, namely the logical zero, is stored in the pair of cross-coupled inverting circuits, the output of the first inverting circuit 202 and the input of the second inverting circuit 204 are at the logical one. This configuration of the pair of cross-coupled inverting circuits activates an NMOS transistor $Q_{10}$ which causes the logical zero to pass onto the BL $R_{BL\_2}$.

Exemplary Semiconductor Fabrication Layouts of the Memory Cell

A semiconductor fabrication technique is used to fabricate one or more semiconductor devices of a memory cell, such as the memory cell 200 to provide an example, onto diffusion layers, polysilicon layers, and/or metallization layers of a semiconductor layer stack as well as interconnections between these layers. FIG. 3 illustrates an exemplary semiconductor layer stack according to an exemplary embodiment of the present disclosure. As illustrated in FIG. 3, a semiconductor layer stack 300 includes multiple metallization layers 302.1 through 302.$n$ interdigitated with multiple insulating layers 304.1 through 304.$n$ on a semiconductor substrate 306. The metallization layers 302.1 through 302.$n$ include one or more conductive materials such as tungsten (W), aluminum (Al), copper (Cu), gold (Au), silver (Ag), or platinum (Pt) to provide some examples. The insulating layers 304.1 through 304.$n$ include one or more non-conductive materials such as silicon dioxide ($SiO_2$) or nitride ($N^{3-}$) to provide some examples. Although not illustrated in FIG. 3, the semiconductor layer stack 300 can include one or more diffusion layers and/or one or more polysilicon layers to form one or more semiconductor devices of the memory cell 200.

The semiconductor fabrication technique can be divided into front-end-of-line (FEOL) processing, middle-end-of-line (MEOL) processing, and back-end-of-line (BEOL) processing. The FEOL processing represents a first portion of the semiconductor fabrication technique which includes formation of the one or more semiconductor devices of the memory cell 200 onto the diffusion layers and the polysilicon layers of the semiconductor layer stack 300. The FEOL processing typically includes forming one or more wells within the semiconductor substrate 306 and the forming various terminals, such as gates, sources, and drains to provide some examples, of the one or more semiconductor devices of the memory cell 200 within and/or onto the semiconductor substrate 306. The MEOL processing represents a second portion of the semiconductor fabrication technique which includes formation of interconnections, such as one or more vias and/or one or more contacts to provide some examples, between the one or more semiconductor devices and the metallization layers 302.1 through 302.$n$. The BEOL processing represents a third portion of the semiconductor fabrication technique which includes formation of the interconnections between these layers.

The discussion to follow illustrates various embodiments for the FEOL processing, the MEOL processing, and the BEOL processing that can be used to form the memory cell 200. However, these embodiments to be discussed in further detail below are not limiting, other embodiments are possible that will be apparent to those skilled in the relevant art(s) without departing from the spirit and scope of the present invention.

Figure 4A:
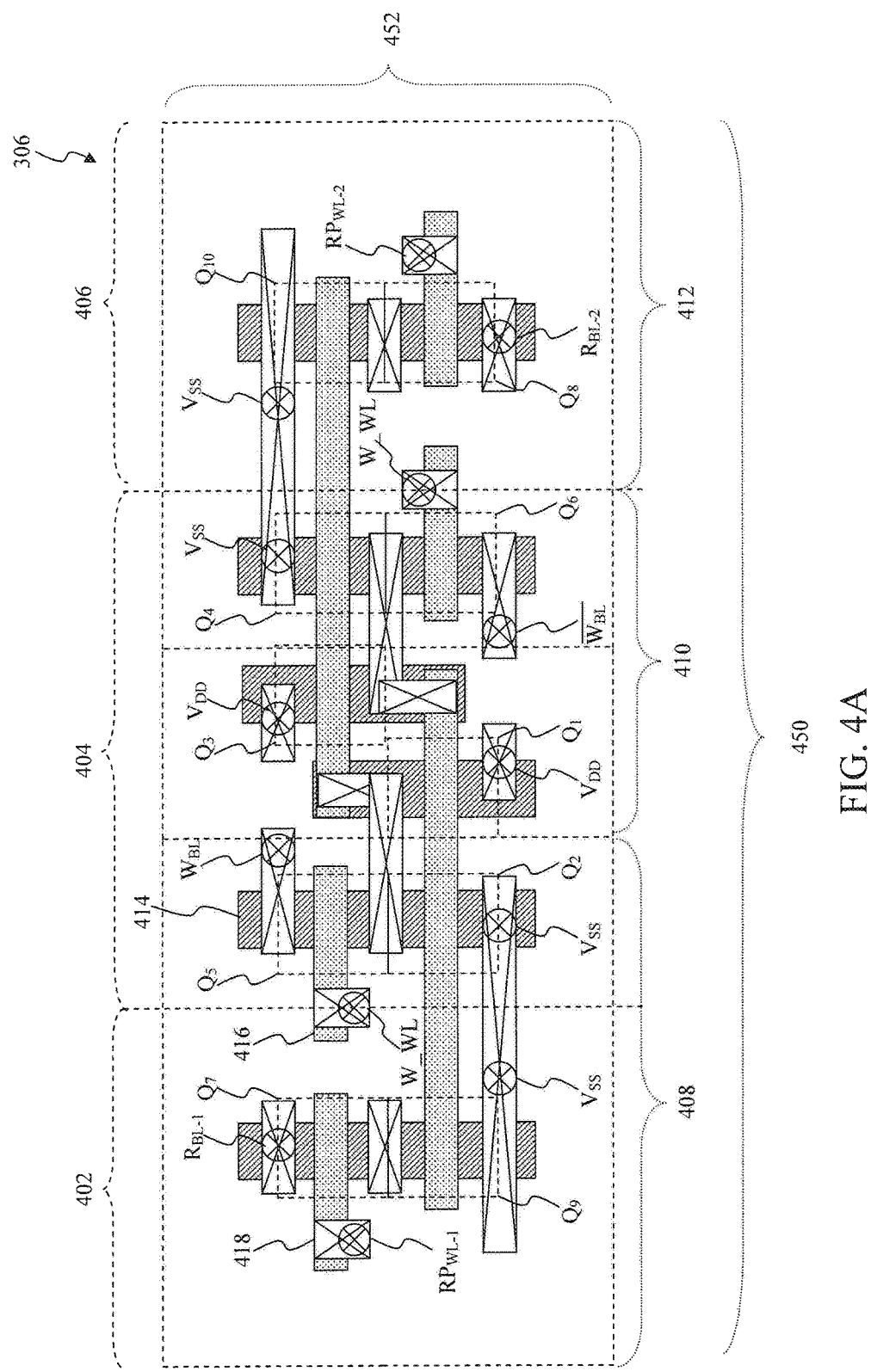
FIG. 4A illustrates a front-end-of-line (FEOL) processing and middle-end-of-line (MEOL) processing for fabricating the memory cell using the semiconductor layer stack according to an exemplary embodiment of the present disclosure.

FIG. 4A illustrates a front-end-of-line (FEOL) processing and middle-end-of-line (MEOL) processing for fabricating the memory cell using the semiconductor layer stack according to an exemplary embodiment of the present disclosure. As illustrated in FIG. 4A, the memory cell 200 is defined in terms of planar geometric shapes which correspond to diffusion layers and polysilicon layers of the semiconductor substrate 306. The memory cell 200 can be logically separated into a first read port 402, a write port 404, and a second read port 406. The first read port 402 includes the NMOS transistor $Q_7$ and the NMOS transistor $Q_9$, the write port 404 includes the PMOS transistor $Q_1$ and the NMOS transistor $Q_2$ of the first inverting circuit 202, the PMOS transistor $Q_3$ and the NMOS transistor $Q_4$ of the second inverting circuit 204, the NMOS transistor $Q_5$, and the NMOS transistor $Q_6$, and the second read port 406 includes the NMOS transistor $Q_8$ and the NMOS transistor $Q_{10}$. As illustrated in FIG. 4A, the NMOS transistor $Q_7$ and the NMOS transistor $Q_9$ of the first read port 402 and the NMOS transistor $Q_2$ and the NMOS transistor $Q_5$ of the write port 404 are formed within a p-well 408, The PMOS transistor $Q_1$ and the PMOS transistor $Q_3$ of the write port 404 are formed within an n-well 410. The NMOS transistor $Q_4$ and the NMOS transistor $Q_6$ of the write port 404 and the NMOS transistor $Q_8$ and the NMOS transistor $Q_{10}$ of the second read port 406 are formed within a p-well 412. As illustrated in FIG. 4A, the memory cell 200 has approximate cell dimensions of x-pitch 450 and y-pitch 452. In an exemplary embodiment, the x-pitch 450 is approximately more than five times larger than the y-pitch 452.

The PMOS transistor $Q_1$, the NMOS transistor $Q_2$, the PMOS transistor $Q_3$, the NMOS transistor $Q_7$, the NMOS transistor $Q_5$, the NMOS transistor $Q_6$, the NMOS transistor $Q_7$, the NMOS transistor $Q_8$, the NMOS transistor $Q_9$, and the NMOS transistor $Q_{10}$, are defined in terms of planar geometric shapes which correspond to active diffusion regions 414 within one or more diffusion layers, and polysilicon regions 416 within one or more polysilicon layers. The active diffusion regions 414, illustrated using hashing in FIG. 4A, represent active diffusion regions upon which active regions of these transistors can be formed. The polysilicon regions 416, illustrated using dotted shading in FIG. 4A, overlap the active diffusion regions to form these transistors devices. Although the PMOS transistor $Q_1$, the NMOS transistor $Q_2$, the PMOS transistor $Q_3$, the NMOS transistor $Q_4$, the NMOS transistor $Q_5$, the NMOS transistor $Q_6$, the NMOS transistor $Q_7$, the NMOS transistor $Q_8$, the NMOS transistor $Q_9$, and the NMOS transistor $Q_{10}$ are illustrated as being planar, two-dimensional transistors in FIG. 4A, those skilled in the relevant art(s) will recognize that the PMOS transistor $Q_1$, the NMOS transistor $Q_2$, the PMOS transistor $Q_3$, the NMOS transistor $Q_4$, the NMOS transistor $Q_5$, the NMOS transistor $Q_6$, the NMOS transistor $Q_7$, the NMOS transistor $Q_8$, the NMOS transistor $Q_9$, and/or the NMOS transistor $Q_{10}$ can be implemented using non-planar, three-dimensional transistors, such as finFETs to provide an example, without departing from the spirit and scope of the present disclosure. In an exemplary embodiment, the NMOS transistor $Q_4$, the NMOS transistor $Q_5$, the NMOS transistor $Q_6$, the NMOS transistor $Q_7$, the NMOS transistor $Q_8$, the NMOS transistor $Q_9$, and/or the NMOS transistor $Q_{10}$ are be implemented using finFETs.

The one or more interconnections 418, illustrated as a squared "x" in FIG. 4A for contacts and a circled "x" in FIG. 4A for vias, couple various regions within the memory cell 200. Typically, the one or more interconnections 418 can include one or more contacts to form interconnections to the diffusion regions 414 or the polysilicon regions 416. The one or more interconnections 418 can also include one or more vias to form interconnections between the metal regions 418 and various other metal regions that are formed during back-end-of-line (BEOL) processing which is to be discussed in further detail below. Furthermore, one or more interconnections 418 can include both a contact and a via that overlaps as shown.

Figure 4B:
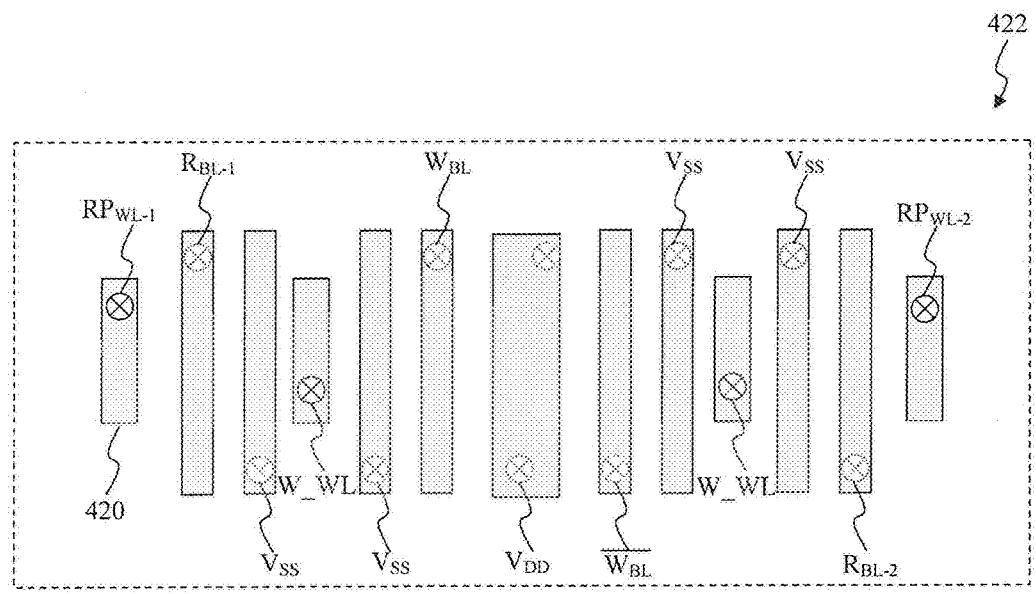
FIGS. 4B through 4F illustrate a back-end-of-line (BEOL) processing for fabricating the memory cell using the semiconductor layer stack according to an exemplary embodiment of the present disclosure.
Figure 4C:
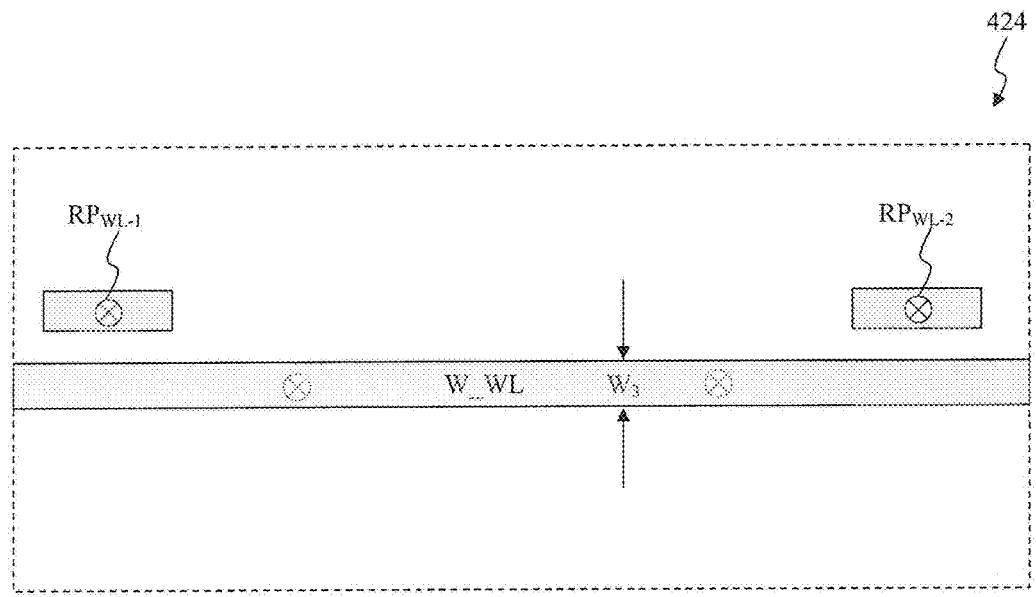
Figure 4D:
Figure 4E:
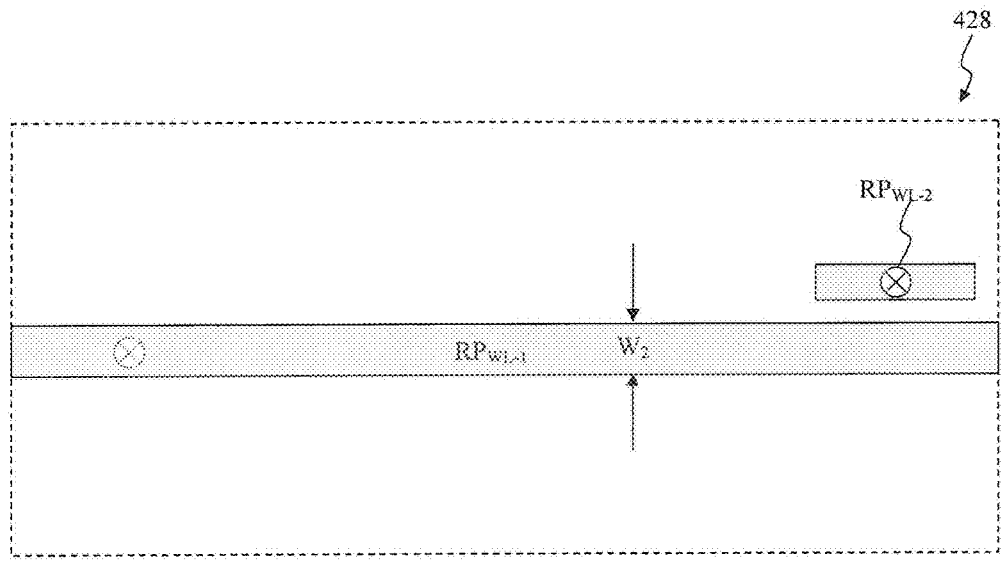
Figure 4F:
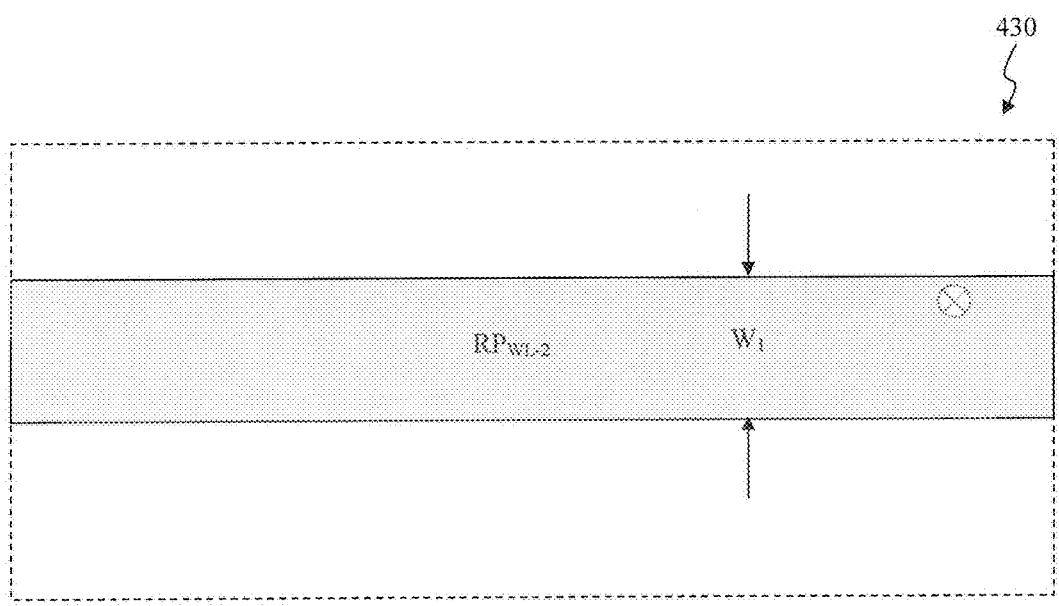

FIGS. 4B through 4F illustrate a back-end-of-line (BEOL) processing for fabricating the memory cell using the semiconductor layer stack according to an exemplary embodiment of the present disclosure. The metal regions 420, illustrated using solid gray shading in FIGS. 4B through 4F, represent regions of one or more conductive materials for routing of signals within the memory cell 200. The one or more conductive materials include one or more conductive materials such as tungsten (W), aluminum (Al), copper (Cu), gold (Au), silver (Ag), or platinum (Pt) to provide some examples. FIG. 4B illustrates a first metallization layer 422, such as the metallization layer 302.1 to provide an example, that is disposed above the semiconductor substrate 306. FIG. 4C illustrates the first port, denoted as W_WL in FIG. 2, formed within a second metallization layer 424, such as the metallization layer 302.2 to provide an example, that is disposed above the first metallization layer 422. FIG. 4D illustrates a third metallization layer 426, such as the metallization layer 302.3 to provide an example, that is disposed above the second metallization layer 424. FIG. 4E illustrates the second port, denoted as $RP_{WL\_1}$ in FIG. 2, formed within a fourth metallization layer 428, such as the metallization layer 302.4 to provide an example, that is disposed above the third metallization layer 426. FIG. 4F illustrates the third port, denoted as $RP_{WL\_2}$ in FIG. 2, formed within a fifth metallization layer 430, such as the metallization layer 302.5 to provide an example, that is disposed above the fourth metallization layer 428. As illustrated in FIGS. 4B through 4F, interconnections between the metallization layers 422 through 430 and the semiconductor substrate 306, as discussed in FIG. 4A, are illustrated with circle "x". Those interconnections that are solid, such as the interconnection at $RP_{WL-1}$ of the first metallization layer 422 to provide an example, connect a metal region 420 with a corresponding metal region 420 of an above metallization layer of the semiconductor layer stack. Those interconnections that are solid, such as the interconnection of $RP_{BL-1}$ of the first metallization layer 422 to provide an example, connect a metal region 420 with a below metallization layer of the semiconductor layer stack.

In an exemplary embodiment, a first width $W_1$ of the conductor for $RP_{WL\_2}$ on the fifth metallization layer 430 is greater than a second width $W_2$ of the conductor for $RP_{WL\_1}$ on the fourth metallization layer 428 which is greater than a third width $W_3$ of the conductor for W_WL on the second metallization layer 424. In another exemplary embodiment, a first thickness $t_1$ of the conductor for $RP_{WL\_2}$ on the fifth metallization layer 430 is greater than a second thickness $t_2$ of the conductor for $RP_{WL\_1}$ on the fourth metallization layer 428. In this other exemplary embodiment, a third thickness $t_3$ of the conductor for W_WL on the second metallization layer 424 is greater than the second thickness $t_2$ of the conductor for $RP_{WL\_1}$. For example, the first thickness $t_1$ of the conductor for $RP_{WL\_2}$ and the third thickness $t_3$ of the conductor for W_WL are both greater than approximately 1.3 times the second thickness $t_2$ of the conductor for $RP_{WL\_1}$.

Figure 5A:
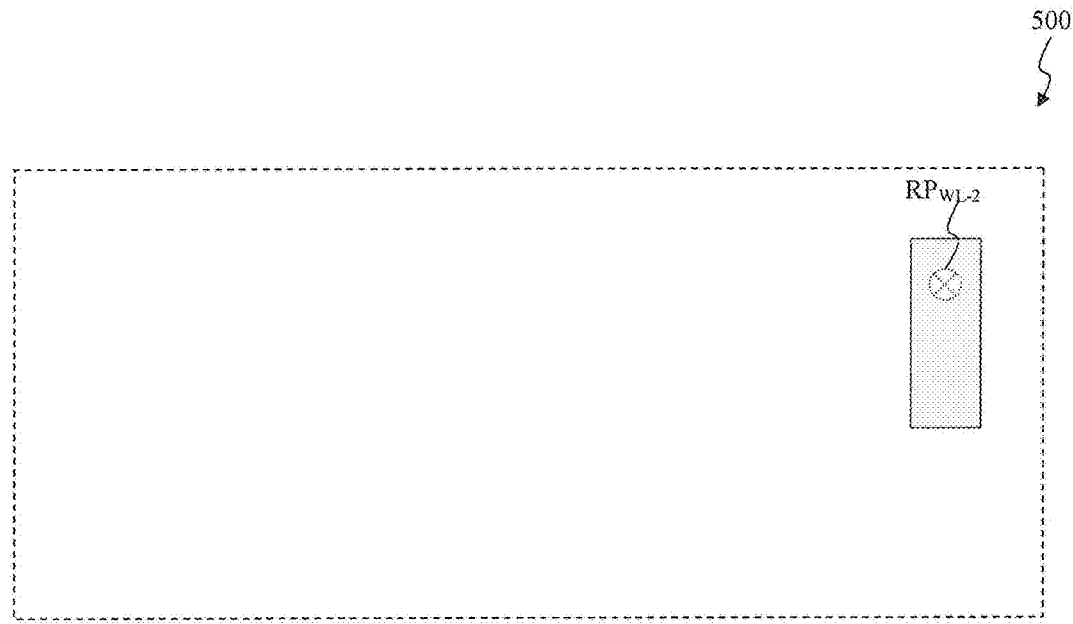
FIGS. 5A through 5B illustrate a first alternate BEOL processing for fabricating the memory cell using the semiconductor layer stack according to an exemplary embodiment of the present disclosure.
Figure 5B:
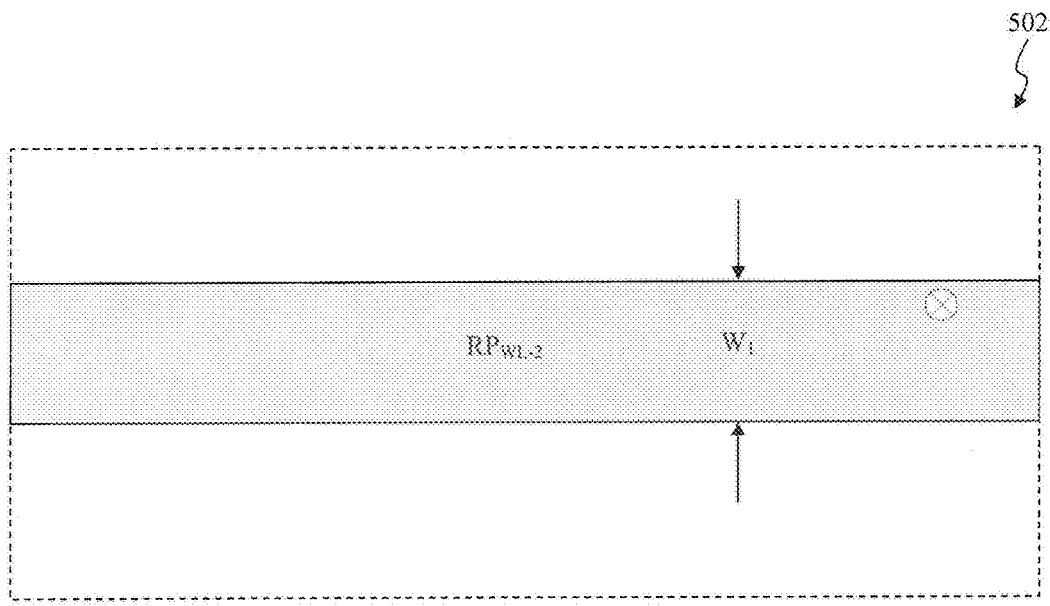

FIGS. 5A through 5B illustrate a first alternate BEOL processing for fabricating the memory cell using the semiconductor layer stack according to an exemplary embodiment of the present disclosure. FIG. 5B illustrates the third port, denoted as $RP_{WL\_2}$ in FIG. 2, formed within a sixth metallization layer 502, such as the metallization layer 302.6 to provide an example, that is disposed above a fifth metallization layer 500, such as the metallization layer 302.5 to provide an example, as illustrated in FIG. 5A.

Figure 6:
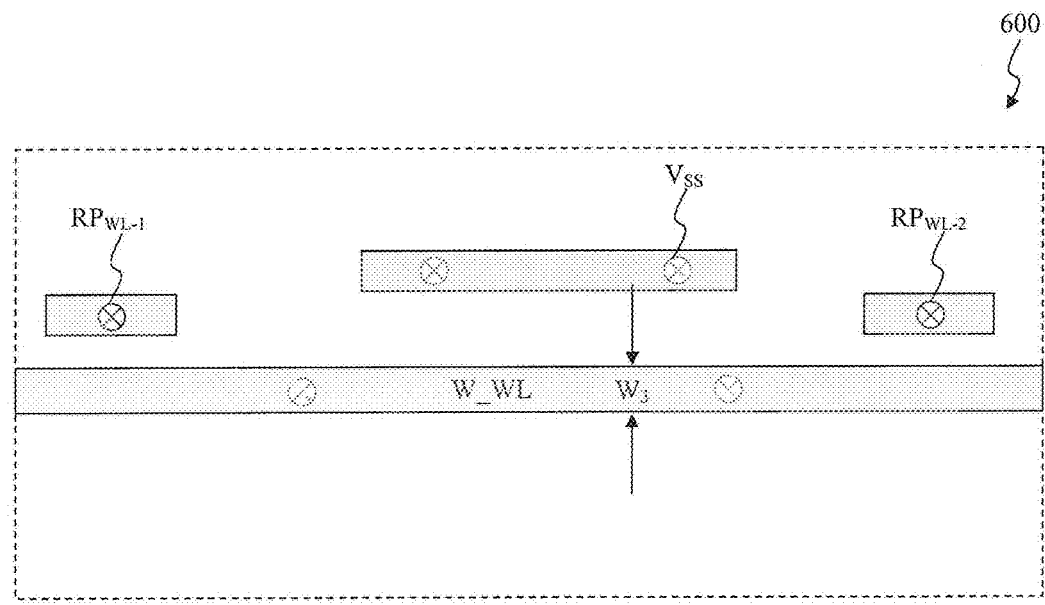
FIG. 6 illustrates a second alternate BEOL processing for fabricating the memory cell using the semiconductor layer stack according to an exemplary embodiment of the present disclosure.

FIG. 6 illustrates a second alternate BEOL processing for fabricating the memory cell using the semiconductor layer stack according to an exemplary embodiment of the present disclosure. FIG. 6 illustrates the first port, denoted as W_WL in FIG. 2, formed within a second metallization layer 600, such as the metallization layer 302.2 to provide an example, that is disposed above the first metallization layer 422. The second metallization layer 600 can be used as an alternative metallization layer for the second metallization layer 424.

Figure 7:
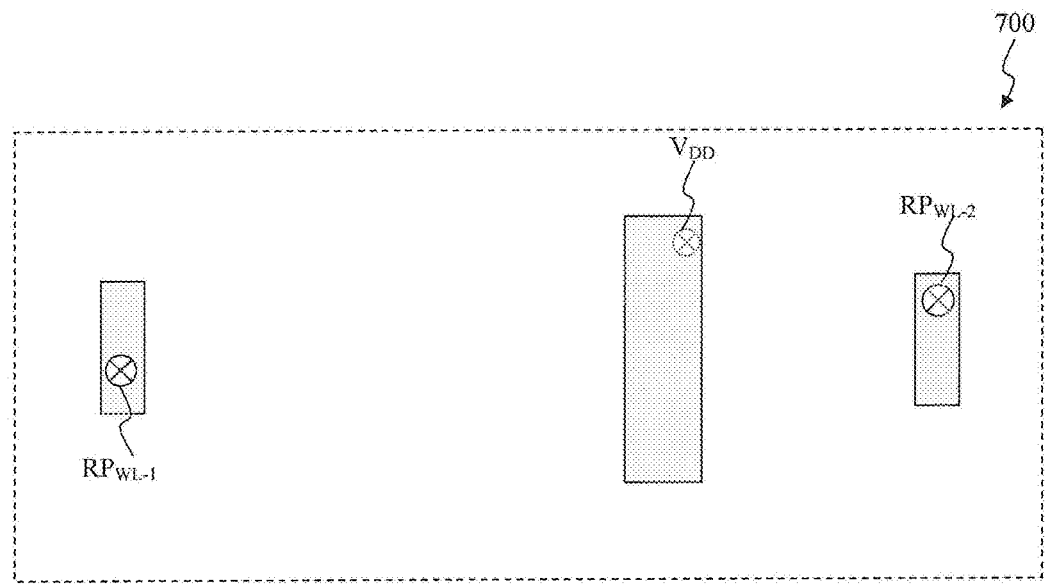
FIG. 7 illustrates a third alternate BEOL processing for fabricating the memory cell using the semiconductor layer stack according to an exemplary embodiment of the present disclosure.

FIG. 7 illustrates a third alternate BEOL processing for fabricating the memory cell using the semiconductor layer stack according to an exemplary embodiment of the present disclosure. FIG. 7 illustrates a third metallization layer 700, such as the metallization layer 302.3 to provide an example, that is disposed above the second metallization layer 424. The third metallization layer 700 can be used as an alternative metallization layer for the third metallization layer 426.

The foregoing Detailed Description discloses a memory cell of a data storage device having at least three ports, such as a write-port, a first read-port, and a second read-port. The write-port can be coupled to a first word-line, the first read-port can be coupled to a second word-line, and the second read-port can be coupled to a third word-line. The memory cell can be of a rectangular shape having a cell longer side, namely a first X-pitch, and a cell shorter side, namely a first Y-pitch. The ratio of the first X-pitch to the first Y-pitch can be larger than five. The memory cell can additionally include first $V_{SS}$, second $V_{SS}$, third $V_{SS}$, fourth $V_{SS}$, $W_{BL}$, $\overline{W_{BL}}$, $R_{BL\_1}$, and $R_{BL\_2}$ conductors located on the same metallization layer of the semiconductor layer stack. Preferably, the first, the second and the third word-lines are formed on different metallization layers of a semiconductor layer stack, follow the same routing direction, and have a length substantially same as the first X-pitch. The first word-line is located on a lower level metallization layer of the semiconductor layer stack, the third word-line is located on a higher level metallization layer of the semiconductor layer stack, and the second word-line on a metallization layer of the semiconductor layer stack between the lower level metallization layer and the higher level metallization layer. These conductors can all follow a first routing direction, and have a length substantially same as the first Y-pitch. In some situations, the semiconductor layer stack can include one or more extra metallization layers, between the second and the third metallization layers or the third and the fourth metallization layers of the semiconductor layer stack, for routing of $RP_{WL-1}$ and $RP_{WL-2}$ conductors. The second metallization layer can include a $V_{SS}$ power mesh line that is electrically connected to the second $V_{SS}$ and the third $V_{SS}$ conductors.

The foregoing Detailed Description also describes a layout structure for a memory cell of a data storage device. The layout structure for the memory cell is rectangular shape and has a cell longer side, namely a first X-pitch, and a cell shorter side, namely a first Y-pitch. The ratio of the first X-pitch to the first Y-pitch can be larger than five. The layout structure includes at least five different metallization layers. The first and third metallization layers follow a first routing direction and the second, fourth and fifth metallization layers follow a second routing direction. The first routing direction is perpendicular to the second routing direction. The second metallization layer that is disposed above the first metallization layer, the third metallization layer that is disposed above the second metallization layer, the fourth metallization layer that is disposed above the third metallization layer, and the fifth metallization layer that is disposed above the fourth metallization layer. The metallization layers include multiple metal lines. The first metallization layer includes four bit-line conductors, such as WBL, $\overline{W_{BL}}$, $\overline{R_{BL\_1}}$, and $R_{BL\_2}$ to provide some examples, a first $V_{SS}$ conductor, a second $V_{SS}$ conductor, a third $V_{SS}$ conductor, a fourth $V_{SS}$ conductor, a first $V_{DD}$ conductor, a first landing pad for a W_WL conductor, a second landing pad for the W_WL conductor. The second metallization layer includes a first landing pad for a $RP_{WL-1}$ conductor, a first landing pad for a $RP_{WL-2}$ conductor, and a conductor for W_WL. The routing direction of the second metallization layer is substantially perpendicular to the routing direction of the first metallization layer. The third metallization layer includes a second landing pad for the $RP_{WL-1}$ conductor, and a second landing pad for the $RP_{WL-2}$ conductor. The fourth metallization layer includes the $RP_{WL-1}$ conductor and a third landing pad for the $RP_{WL-2}$ conductor. The fifth metallization layer includes the $RP_{WL-2}$ conductor.

The foregoing disclosure outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A multiple port memory cell for a data storage device, the multiple port memory cell comprising:
   a diffusion layer of a semiconductor stack having a plurality of transistors;
   a first metallization layer of the semiconductor stack having a first conductor connected to a first transistor from among the plurality of transistors, the first conductor representing a write port of the multiple port memory cell;
   a second metallization layer of the semiconductor stack, disposed above the first metallization layer, having a second conductor connected to a second transistor from among the plurality of transistors, the second conductor representing a first read port of the multiple port memory cell; and
   a third metallization layer of the semiconductor stack, disposed above the second metallization layer, having a third conductor connected to a third transistor from among the plurality of transistors, the third conductor representing a second read port of the multiple port memory cell.

2. The multiple port memory cell of claim 1, wherein a first width of the first conductor is less than a second width of the second conductor, and
   wherein the second width of the second conductor is less than a third width of the third conductor.

3. The multiple port memory cell of claim 2, wherein a first thickness of the first conductor is greater than a second thickness of the second conductor, and
   wherein a third thickness of the third conductor is greater than the second thickness of the second conductor.

4. The multiple port memory cell of claim 1, wherein the semiconductor stack is a rectangular shape having an X-pitch and a Y-pitch, the X-pitch being proportionally larger than the Y-pitch.

5. The multiple port memory cell of claim 4, wherein the X-pitch is at least five times larger than the Y-pitch.

6. The multiple port memory cell of claim 4, wherein the first conductor, the second conductor, and the third conductor have lengths that are approximately equal to the Y-pitch.

7. The multiple port memory cell of claim 1, wherein the first metallization layer comprises:
   a first landing pad and a second landing pad to connect the second conductor to the second transistor and the third conductor to the third transistor, respectively, and
   wherein the third metallization layer comprises:
   a third landing pad to connect the third conductor to the third transistor.

8. The multiple port memory cell of claim 1, further comprising:
   a fourth metallization layer of the semiconductor stack, disposed between the diffusion layer and the first metallization layer, having a plurality of conductors, each of the plurality of conductors being connected to corresponding transistors from among the plurality of transistors,
   wherein the plurality of conductors of the fourth metallization layer is arranged in a direction that is perpendicular to the first conductor, the second conductor, and the third conductor.

9. The multiple port memory cell of claim 1, wherein the first conductor, the second conductor, and the third conductor follow a substantially similar routing direction.

10. A multiple port memory cell for a data storage device, the multiple port memory cell comprising:
    a first inverting circuit;
    a second inverting circuit cross-coupled to the first inverting circuit;
    a first transistor and a second transistor coupled to a first output of the first inverting circuit and a second output of the second inverting circuit, respectively, the first transistor and the second transistor being connected to a first conductor on a first metallization layer of a semiconductor stack forming a write port of the multiple port memory cell;
    a third transistor and a fourth transistor coupled to a first input of the first inverting circuit, the third transistor and the fourth transistor being connected to a second conductor on a second metallization layer, disposed above the first metallization layer of the semiconductor stack, forming a first read port of the multiple port memory cell; and
    a fifth transistor and a sixth transistor coupled to a second input of the second inverting circuit, the fifth transistor and the sixth transistor being connected to a third conductor on a third metallization layer, disposed above the second metallization layer of the semiconductor stack, forming a second read port of the multiple port memory cell.

11. The multiple port memory cell of claim 10, wherein a first width of the first conductor is less than a second width of the second conductor, and
    wherein the second width of the second conductor is less than a third width of the third conductor.

12. The multiple port memory cell of claim 11, wherein a first thickness of the first conductor is greater than a second thickness of the second conductor, and wherein a third thickness of the third conductor is greater than the second thickness of the second conductor.

13. The multiple port memory cell of claim 11, wherein the semiconductor stack is a rectangular shape having an X-pitch and a Y-pitch, the X-pitch being proportionally larger than the Y-pitch.

14. The multiple port memory cell of claim 13, wherein the first conductor, the second conductor, and the third conductor have lengths that are approximately equal to the Y-pitch.

15. The multiple port memory cell of claim 11, wherein the first conductor, the second conductor, and the third conductor follow a substantially similar routing direction.

16. A data storage device, comprising:
a plurality of multiple port memory cells arranged to form an array of multiple port memory cells, each multiple port memory cell from among the plurality of multiple port memory cells comprising:
  a first inverting circuit;
  a second inverting circuit cross-coupled to the first inverting circuit;
  a first transistor and a second transistor coupled to a first output of the first inverting circuit and a second output of the second inverting circuit, respectively, the first transistor and the second transistor being connected to a first conductor on a first metallization layer of a semiconductor stack forming a write port of the multiple port memory cell;
  a third transistor and a fourth transistor coupled to a first input of the first inverting circuit, the third transistor and the fourth transistor being connected to a second conductor on a second metallization layer, disposed above the first metallization layer of the semiconductor stack, forming a first read port of the multiple port memory cell; and
  a fifth transistor and a sixth transistor coupled to a second input of the second inverting circuit, the fifth transistor and the sixth transistor being connected to a third conductor on a third metallization layer, disposed above the second metallization layer of the semiconductor stack, forming a second read port of the multiple port memory cell;
a column decoder configured to decode a first portion of an address to select a column of memory cells from among the array of multiple port memory cells; and
a row decoder configured to decode a second portion of the address to select a row of memory cells from among the array of multiple port memory cells.

17. The data storage device of claim 16, wherein a first width of the first conductor is less than a second width of the second conductor, and
  wherein the second width of the second conductor is less than a third width of the third conductor, and
  wherein a first thickness of the first conductor is greater than a second thickness of the second conductor, and
  wherein a third thickness of the third conductor is greater than the second thickness of the second conductor.

18. The data storage device of claim 16, wherein the semiconductor stack is a rectangular shape having an X-pitch and a Y-pitch, the X-pitch being proportionally larger than the Y-pitch.

19. The data storage device of claim 18, wherein the first conductor, the second conductor, and the third conductor have lengths that are approximately equal to the Y-pitch.

20. The data storage device of claim 16, wherein the first conductor, the second conductor, and the third conductor follow a substantially similar routing direction.

* * * * *